United States Patent [19]

Kinoshita

[11] Patent Number: 4,493,083
[45] Date of Patent: Jan. 8, 1985

[54] SYSTEM FOR UPDATING DATA IN BUBBLE MEMORIES

[75] Inventor: Mitsuo Kinoshita, Hachioji, Japan

[73] Assignee: Fanuc Ltd., Tokyo, Japan

[21] Appl. No.: 403,661

[22] PCT Filed: Nov. 18, 1981

[86] PCT No.: PCT/JP81/00340
§ 371 Date: Jul. 27, 1982
§ 102(e) Date: Jul. 27, 1982

[87] PCT Pub. No.: WO82/01958
PCT Pub. Date: Jun. 10, 1982

[30] Foreign Application Priority Data

Nov. 28, 1980 [JP] Japan ................. 55-167770

[51] Int. Cl.³ .............. G11C 29/00; G06F 11/00
[52] U.S. Cl. .................... 371/66; 364/184; 365/228
[58] Field of Search ........... 371/66, 13; 364/184; 365/228

[56] References Cited

U.S. PATENT DOCUMENTS

| | | | |
|---|---|---|---|
| 3,691,357 | 9/1972 | McIntosh | 364/184 X |
| 4,045,660 | 8/1977 | Weisgerber et al. | 364/184 X |
| 4,055,787 | 10/1977 | Beadle et al. | 364/184 X |
| 4,216,541 | 8/1980 | Clover et al. | 371/13 X |
| 4,327,410 | 4/1982 | Patel et al. | 364/200 |
| 4,335,436 | 6/1982 | Inoue | 364/474 |
| 4,393,500 | 7/1983 | Imazeki et al. | 371/13 |

FOREIGN PATENT DOCUMENTS

| | | |
|---|---|---|
| 50-34753 | 4/1975 | Japan . |
| 53-32631 | 3/1978 | Japan . |
| 53-92634 | 8/1978 | Japan . |
| 55-34345 | 3/1980 | Japan . |
| 55-59558 | 5/1980 | Japan . |
| 55-135395 | 10/1980 | Japan . |
| 55-134465 | 10/1980 | Japan . |
| 55-138155 | 10/1980 | Japan . |

OTHER PUBLICATIONS

Heasley, Jr. et al., Error Correction by Reconfiguring, IBM Tech. Discl. Bulletin, vol. 10, No. 10, Mar. 1968, pp. 1543-1544.

Primary Examiner—Charles E. Atkinson
Attorney, Agent, or Firm—Staas & Halsey

[57] ABSTRACT

A data update system in a bubble memory in which, to preserve the simultaneity of data in the event of a power failure during the updating of data in the bubble memory, initialization data is written into a specific data storage area of the bubble memory the initialization data indicates that the data in a first data storage area is invalid, and new data is subsequently written into the first data storage area from a first record to a last record successively under the control of a bubble memory controller. The initialization data is thereby erased after the new data is completely written in the first data storage area, after which the new data, written in the first data storage area, is again written into a second data storage area from the first record to the last record thereof.

3 Claims, 3 Drawing Figures

SYSTEM FOR UPDATING DATA IN BUBBLE MEMORIES

BACKGROUND OF THE INVENTION

This invention relates to a method for updating data in bubble cassette memories and, more particularly, to a method for updating data in a bubble memory which enables the simultaneity of data to be preserved even if a power failure should occur in the course of the updating operation.

Wire-cut electric discharge machines are well-known in the art. In such machines a wire is tensioned between an upper guide and a lower guide, and an electric discharge is produced between the wire and a workpiece placed on a table. By moving the workpiece (table) in the X and Y directions along a machining path, the workpiece is cut as instructed. When the wire is tensioned so as to lie perpendicular to the table (workpiece), the upper and lower surfaces of the workpiece can be cut to the same shape. It is also possible to adopt an arrangement in which the upper guide can be displaced in the X and Y directions, such as in a direction at right angles to the direction in which the workpiece is travelling, to incline the wire with respect to the workpiece. This causes the upper and lower surfaces of the workpiece to be cut to different shapes, enabling so-called taper cutting.

A discharge machining operation performed by the wire-cut discharge machine of the aforesaid type can continue for an extremely long period of time, such as 12 hours, 24 hours, and even for as long as one week in some cases. The workpieces which are cut by electric discharge machining generally are mold materials and the like, and some materials can be extremely expensive.

Accordingly, since an interruption in power can occur during machining, such as by inadvertently turning off the power supply or as the result of a power failure due to a lightening bolt or some other cause, it is desired that cutting be resumed, as soon as power is restored, from the position formerly occupied by the wire electrode prior to the power interruption. This prevents the workpiece from being wasted. For a long-term discharge machining operation of one day or one week, as mentioned above, machining proceeds continuously day and night. It follows, then, that there is need for a system which, in the event of a power interruption that occurs at night, is capable of resuming machining automatically without operator intervention after power is restored.

When power is interrupted, there is destruction of information indicative of the current and commanded positions of a motor or of a movable element such as the table, and destruction of positional control information relating to backlash direction, pitch error compensation dog number and the like. There is also complete destruction of the internal status of an NC, which includes interpolation control information such as the number of interpolation pulses produced prior to the power interruption as well as the block number, counting from the beginning of the numerical control data. Also, when power is interrupted, the motor or a movable element such as the table moves by a small amount on the order of several microns, by way of example. Accordingly, when power is cut off during a discharge machining operation in the prior-art arrangement, discharge machining cannot be resumed immediately, in automatic fashion without human intervention, from the position occupied before the interruption in power. Instead, it has been conventional practice to adopt the method based upon the following sequence:

(1) The cutting starting point of the discharge machining operation is stored in memory in advance. For example, this may be set in a digital switch or stored in non-volatile memory.

(2) Following the restoration of power the wire is removed and the table or wire is returned to the zero point of the machine. This brings the position of the table, which is the movable element, or of the wire into coincidence with the current position stored in a volatile memory.

(3) Following the return to the zero point, the table or wire is positioned at the cutting starting point by using the cutting starting point information stored in the non-volatile memory or set on the digital switch.

(4) Upon completion of the cutting starting point positioning operation, the wire is rethreaded and a return is effected to the beginning of the numerical control data.

(5) The operator rewinds the command tape to the beginning of the data. The table or wire is then moved along the programmed path at a speed greater than the commanded speed, starting from the beginning of the numerical control command data. This causes the table or wire to travel along the previously cut path. By way of example, a well-known dry-run function can be employed to transport the wire or table at the higher speed.

(6) When the table or wire has been moved as far as a position just short of that occupied at the time of the power interruption, the feed speed of the table is restored to that specified by the program, machining power is introduced, and an electric current is passed through the wire to resume the discharge machining operation.

With the conventional method as described above, processing following the re-introduction of power is extremely complicated and a considerable period of time is required to restore the cutting operation. The result is a marked decline in machining efficiency. Since an operator intervenes in order to resume the machining operation, moreover, an interruption in machining caused by a power failure which occurs at night or during a holiday will not be remedied until the next working day. This greatly diminishes machining efficiency.

In view of the foregoing, the Applicant has already proposed a status recovery system wherein machining is resumed automatically, and wherein the restarting of a machining operation following the re-introduction of power is accomplished in a short period of time requiring neither a return to a zero point, movement to a cutting starting point nor rethreading of the wire. This previously proposed status restoration system will now be described in brief.

As mentioned above, such information as positional control and interpolation information stored in the memory of a numerical control device is destroyed when power is interrupted, and a table or other movable member traverses a very short distance (several microns) upon the occurrence of the power interruption. Accordingly, when power is interrupted owing to a power failure or the like, machining can be resumed automatically by restoring the main power supply providing that the following conditions are satisfied: (A)

power is capable of being applied to the numerical control device automatically by restoring the main power supply; (B) the movable member such as the table is capable of being returned automatically to the position occupied prior to the interruption in power; and (C) the internal status of the numerical control device is capable of being restored automatically to the status which prevailed prior to the interruption in power.

To this end, in accordance with the previously proposed system, a device is provided which, in response to restoration of the main power supply, automatically introduces electric power to the numerical control device and the like. Further, in order to automatically return the movable member such as the table to the position occupied prior to the power interruption, the positional information which prevailed prior to the power interruption is preserved in a non-volatile memory. Also provided is a position sensor capable of sensing the absolute position of the motor or of the movable member such as the table. Following the application of electric power, the movable member such as the table is positioned and returned to the position occupied prior to the power interruption by using the positional control information which prevailed prior to the power interruption, which information is stored in the non-volatile memory, and the absolute position detected by the position sensor.

Furthermore, to automatically restore the internal status of the numerical control device to what it was before the interruption in power, in accordance with the previously proposed system, the location of a block which contains the numerical control data that prevailed prior to the power interruption, as well as such interpolation information as the number of interpolation pulses in said block, are stored in the non-volatile memory, and the numerical control command data from the beginning of the data is retrieved so that numerical control processing can be re-executed starting from the retrieved numerical control data. Then, after power is restored, the motor and the movable element such as the table are locked against movement, numerical control processing is executed sequentially starting from the numerical control command data at the beginning of the program, and processing is halted temporarily when the block location and the number of interpolation pulses, which is based on the numerical control command of said block, coincide with the block location and the number of interpolation pulses, respectively, stored in the non-volatile memory. The internal status of the numerical control device is thus made to coincide with what it was immediately prior to the interruption in power. When the conditions which prevailed just prior to the power interruption are restored, the feed of machining fluid and the introduction of electric current to the wire are carried out, and discharge machining is resumed.

In accordance with the previously disclosed system as described above, therefore, excellent effects are obtained since the discharge machining operation can be resumed automatically without human intervention once power has been applied following the power interruption.

In the previously proposed system, the non-volatile memory stores the positional control information such as the current position prior to the power interruption, the block location containing the numerical control command data which prevailed at such time, as well as the interpolation information such as the interpolation pulses in said block. A bubble memory is employed as the non-volatile memory. The above-mentioned positional control information and interpolation information is successively written into the bubble memory periodically at predetermined short time intervals to update the data within the bubble memory, so that the most recent positional control information and interpolation information is stored in the non-volatile memory at all times.

The numerical control information and interpolation information stored in the bubble memory is large in quantity and cannot be written into the memory by a single command. Instead, the information is written into the memory by dividing the information into a number of portions each of which is written at a separate time. If a power failure or the like were to occur during the writing of new data into the bubble memory, therefore, part of the data in the memory would be new, and part would be old. The simultaneity of the data would therefore be destroyed, and it would not be possible to execute the correct processing to cope with the power failure.

SUMMARY OF THE INVENTION

An object of the present invention is to provide a system for updating data in a bubble memory which enables the simultaneity of data to be preserved, and which allows an electric discharge machining operation to be resumed correctly, even if a power failure should occur during the updating of the data.

Specifically, a bubble memory is provided with first and second data storage areas, initialization data is written into a predetermined location of the bubble memory (for example, at the location of the last record of the first data storage area) before the updating of data, new data is subsequently written into the first data storage area, the specific data is erased by completing the writing of the new data, and the new data is then written into the second data storage area. In a case where this arrangement is applied to a system for restoring the status of a numerically controlled wire-cut electric discharge machine, the status of the numerically controlled wire-cut electric discharge machine is stored in the bubble memory at predetermined intervals, a check is performed after restoring power following a power interruption to determine whether the initialization data is written in the bubble memory, and the status which prevailed just prior to the power interruption is restored on the basis of the data stored in the second data storage area if the inialization data is present, or on the basis of the data stored in the first data storage area if the initialization data has been erased.

DESCRIPTION OF THE PREFERRED EMBODIMENT

An embodiment of the present invention will now be described in conjunction with the drawings.

Figure 1:
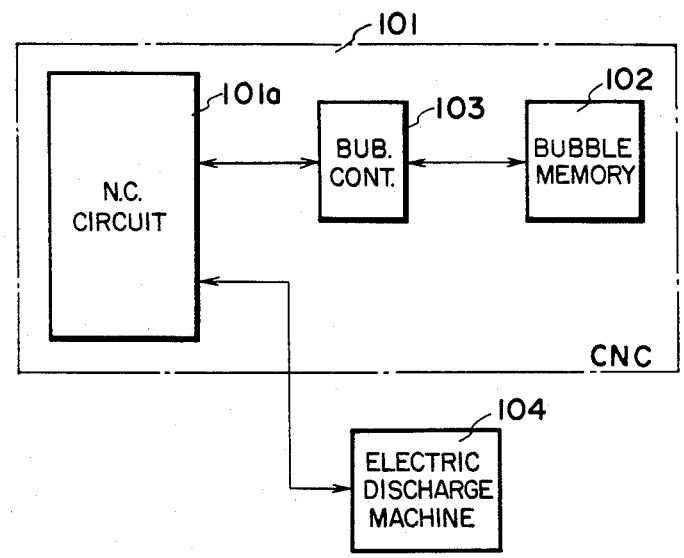
FIG. 1 is a block diagram of an arrangement to which the present invention can be applied.

FIG. 1 is a block diagram of an arrangement to which the present invention can be applied. Numeral 101 denotes a numerical control device (referred to hereinafter as a CNC) having a built-in computer. Numeral 101a denotes a numerical control circuit, and 102 a bubble memory for storing numerical control information and interpolation information at predetermined intervals under the control of the CNC. More specifically, the bubble memory 102 has its contents updated successively with new data. Numeral 103 denotes a well-known bubble controller including a buffer memory, a read/write control circuit, and the like. Numeral 104 denotes an electric discharge machine.

Figure 2:
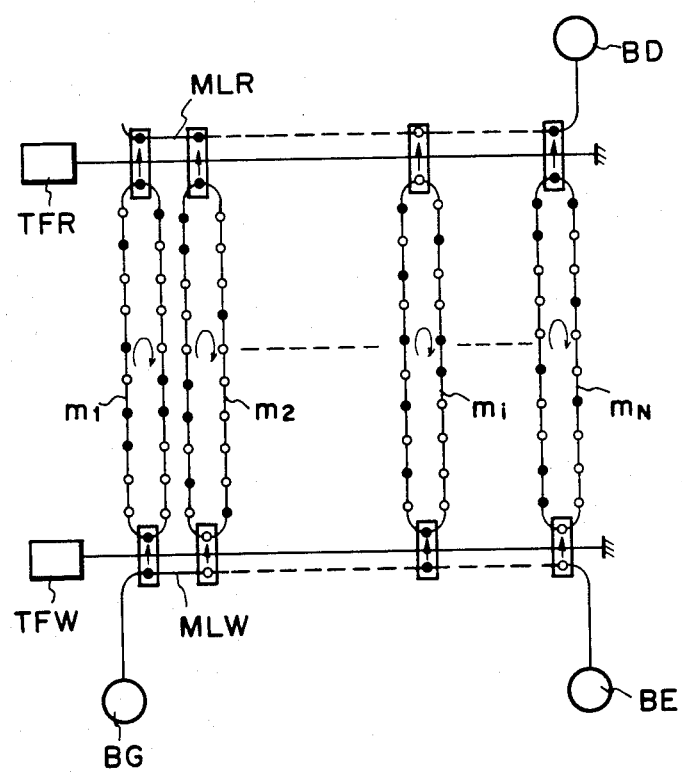
FIG. 2 is a diagram useful in describing the reading and writing of information with respect to a bubble memory.

FIG. 2 is an explanatory view useful in describing the reading and writing of information with respect to a bubble memory.

In FIG. 2, $m_1, m_2, m_3, \ldots, m_N$ denote minor loops which are a total of N in number. Each minor loop is constructed as a closed loop comprising a bubble domain transfer track of 2M bits. Each loop may, for example, be a continuous loop of T-bar patterns. BG represents a bubble generator, BE a bubble erasor, MLR a read-only major line, and MLW a write-only major line. The minor loops $m_1, m_2, \ldots, m_N$ are arranged with one end adjoining the major line MLR and the other end adjoining the major line MLW. When a transfer command is issued by a transfer TFR, those bubble domains (the black circles in the drawing) at bit positions in the minor loops $m_1, m_2, \ldots, m_N$ that are at the locations adjacent the read-only major line MLR at that instant are transferred to the read-only major line MLR. When a transfer command is issued by a transfer TFW, those bubble domains (the black circles in the drawing) which have been written into the write-only major line MLW are transferred to the minor loops $m_1, m_2, \ldots, m_N$ at the locations where the minor loops are adjacent to the major line MLW.

Processing for the reading and updating of data will be described next.

In reading one access unit of stored information comprising N bits, bubble domains in the N-number of minor loops $m_1, m_2, \ldots, m_N$ are transferred in parallel to the read-only major line MLR in response to the transfer command. In the magnetic bubble memory of FIG. 2, if we let the information of 2M bits stored in each minor loop $m_i$ (i=1, 2, ... N) be expressed by b(i,b), b(i,2), ..., b(i,2M−1), b(i,2M), then one access unit of stored information will be taken to mean N-bit information comprising the bits expressed by {b(i,j), b(2,j), ..., b(N,j)}, where j=1, 2, ..., 2M. This one access unit of stored information is generally referred to as a page or block, and comprises 64 bytes.

The bubble domains which have been transferred to the read-only major line MLR are shifted successively bit-by-bit to provide an output of serial data. Accordingly, if a bubble detector BD such as one which relies upon magneto-resistance is provided at the exit of the read-only major line MLR, the output information may be read by sensing the absence or presence of the bubble domains. It should be noted that, in a read operation, destructive read and non-destructive read operations can be carried out wherein one access unit of the bubble domains in the minor loops $m_1, m_2, \ldots, m_N$ is erased in the former but not erased in the latter. In an ordinary read operation, however, information is read non-destructively.

In updating information, on the other hand, one desired access unit of information in the minor loops $m_1, m_2, \ldots, m_N$ is erased by a destructive read operation as the first step (erase cycle). Since each of the minor loops $m_1$ through $m_N$ comprises 2M bits, there are M bits arrayed between the read-only major line MLR and the write-only major line MLW, and the bubble domains in each of the minor loops $m_1$ through $m_N$ will make exactly one revolution in response to 2·M cycles of the applied rotating field. Furthermore, stored information in the minor loops $m_1$ through $m_N$ that was at the locations adjacent to the read-only major line MLR arrives at the transfer area of the write-only major line MLW in response to M cycles of the rotating field.

Accordingly, if N-bit information which has been prepared beforehand at the write-only major line MLW is transferred in parallel to the respective minor loops $m_1$ through $m_N$ in response to a transfer command from the transfer TFW after M cycles of the rotating field following the destructive read operation, then new information will be written into the bit positions (which will be all "0"s) cleared by the destructive read (write cycle). This completes the update processing.

Figure 3:
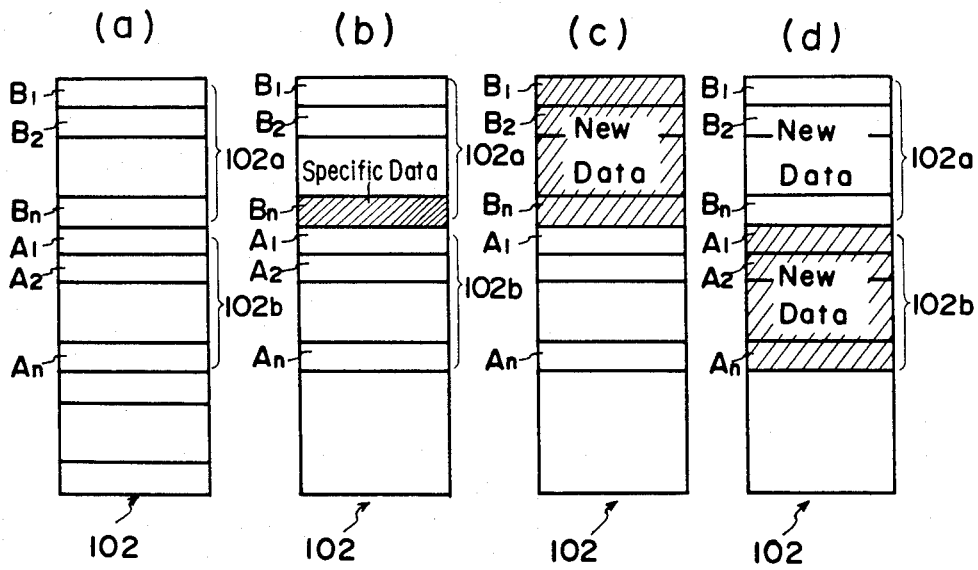
FIG. 3 is a diagram useful in describing a system for updating data in a bubble cassette memory in accordance with the present invention.

FIG. 3 is an explanatory view useful in describing a data updating system in a bubble cassette memory in accordance with the present invention. More specifically, the bubble memory 102 is provided with first and second data storage areas 102a and 102b, into which the same data is written in duplicate. In the Figure, $B_1$ through $B_n$ and $A_1$ through $A_n$ represent record areas (referred to hereinafter simply as records) for storing one block of data each.

In the present invention, positional control information and interpolation information are stored in a bubble memory through a procedure which will now be described.

First, initialization data, such as all "1"s which, if read later, will indicate the fact that the data in the first data storage area 102a is invalid, is written into the last record $B_n$ of the first data storage area (FIG. 3(b)). Next, items of positional control information and interpolation information are written successively into the first data storage area 102a from the first record $B_1$ to the last record $B_n$ under the control of the bubble controller (FIG. 1). Completing the writing of the above information into the first storage area 102a therefore writes new data into the first storage area and causes normal data to be written into the last record B (FIG. 3(c)). After finishing the above-described updating of data into the first data storage area 102a, the operation for updating data into the bubble memory will be completed when the above-mentioned data, written into the first storage area 102a, is written into the second data storage area 102b from the first record $A_1$ to the last record $A_n$ (FIG. 3(d)).

If data is thus written into the first and second storage areas 102a and 102b in duplicate form, the data can be restored to its former state, even in the event of a power failure during the update operation, following the restoration of power. The procedure is as follows.

First, the data in the last record Bn of the first storage area 102a is read following the restoration of power. Next, the data which has been read is discriminated to determine whether it is the initialization data (all "1"s). If it is, this indicates that the power failure occurred during the updating of data into the first storage area 102a. Accordingly, if the data which has been stored in the second storage area 102b is read and fed into the CNC, it becomes possible for the CNC to use this data to correctly restore the conditions which prevailed just prior to the power failure. If the discriminated data read out of the last record $B_n$ is found not to be the initialization data, on the other hand, this signifies that the data stored in the first storage area 102a is the most recently fully recorded data. If the data stored in the first storage area 102a is read out and fed into the CNC, therefore, the CNC will employ this data to correctly restore the conditions which prevailed prior to the power failure.

It has been described above that the initialization data is written into the last record of the first storage area before the update operation, and that the initialization data is replaced by normal data by completing the writing of new data. Such an arrangement is not a strict requirement, however, for the initialization data may be written into a record other than one in the first and second storage areas and then erased in response to the completion of the update operation with the respect to the first storage area. With this alternative approach, however, a somewhat longer time is required for updating.

In accordance with the present invention as described above, data is written into a bubble memory in duplicate form. In the event of an interruption in power during an update operation, therefore, the simultaneity of data can be preserved and the conditions which prevailed prior to the power interruption can be restored correctly, enabling machining to be resumed.

While a case has been described where the present invention is applied for restoring conditions which prevailed prior to a power interruption in an electric discharge machine, it is obvious that the invention has other applications and is not limited to the foregoing arrangement.

What is claimed is:

1. A data update method for updating data stored in a bubble memory with new data, the bubble memory having first and second data storage areas, the data update method in the bubble memory comprising the steps of:
   writing initialization data in the first data storage area of the bubble memory before updating of the data;
   updating the data, comprising the steps of:
   writing the new data into the first data storage area, the initializaton data being erased by completing the writing of the new data; and
   writing the new data into the second data storage area.

2. A data update method in a bubble memory according to claim 1,
   wherein the first and second data storage areas are divided into records, and
   wherein the initialization data is written into the location of the last record of the first data storage area.

3. A data update method in a bubble memory according to claim 1 or 2,
   wherein a numerically controlled wire-cut electric discharge machine is operatively connected to the bubble memory, and
   said method further comprising the steps of:
   storing the status of the numerically controlled wire-cut electric discharge machine in the bubble memory at predetermined intervals;
   checking after restoring power following a power interruption to determine whether the initialization data is written in the bubble memory; and
   restoring the status which prevailed just prior to the power interruption on the basis of the data stored in the second data storage area if the initialization data is present, or on the basis of the data stored in the first data storage area if the initialization data has been erased.

* * * * *

UNITED STATES PATENT AND TRADEMARK OFFICE
CERTIFICATE OF CORRECTION

PATENT NO. : 4,493,083
DATED : January 8, 1985
INVENTOR(S) : Kinoshita

It is certified that error appears in the above-identified patent and that said Letters Patent is hereby corrected as shown below:

On the title page;

[57], ABSTRACT, line 5, "memory" should be --memory,--.

Col. 6, line 44, "B" should be --$B_n$--;
line 57, "Bn" should be --$B_n$--.

Col. 8, line 7, "initializaton" should be --initialization--.

Signed and Sealed this

Thirteenth Day of August 1985

[SEAL]

Attest:

DONALD J. QUIGG

*Attesting Officer*   *Acting Commissioner of Patents and Trademarks*